(12) United States Patent
Mehta et al.

(10) Patent No.: US 6,404,212 B1
(45) Date of Patent: Jun. 11, 2002

(54) TESTING OF BGA AND OTHER CSP PACKAGES USING PROBING TECHNIQUES

(75) Inventors: Rajiv Mehta; Liop Jin Yap; Raymundo M. Camenforte; Chee-Keong Tan, all of Singapore (SG)

(73) Assignee: St Assembly Test Services Pte Ltd, Singapore (SG)

( * ) Notice: Subject to any disclaimer, the term of this patent is extended or adjusted under 35 U.S.C. 154(b) by 0 days.

(21) Appl. No.: 09/252,629

(22) Filed: Feb. 18, 1999

(51) Int. Cl.[7] .............................................. G01R 31/02
(52) U.S. Cl. ....................... 324/754; 324/758
(58) Field of Search ................... 324/754, 755, 324/758, 765; 414/222.01, 222.02, 222.04, 222.05, 222.06, 222.07, 222.13

(56) References Cited

U.S. PATENT DOCUMENTS

| | | | |
|---|---|---|---|
| 5,290,134 A | * 3/1994 | Baba | 414/404 |
| 5,510,724 A | * 4/1996 | Itoyama et al. | 324/760 |
| 5,563,520 A | * 10/1996 | Terada | 324/754 |
| 5,570,033 A | 10/1996 | Staab | 324/761 |
| 5,574,668 A | 11/1996 | Beaty | 364/558 |
| 5,648,728 A | * 7/1997 | Canella | 324/755 |
| 5,721,496 A | 2/1998 | Farnworth et al. | 324/765 |
| 5,729,896 A | 3/1998 | Dalal et al. | 29/840 |

* cited by examiner

Primary Examiner—Michael J. Sherry
Assistant Examiner—Russell M. Kobert
(74) Attorney, Agent, or Firm—George O. Saile; Stephen B. Ackerman

(57) ABSTRACT

A method and apparatus for handling small semiconductor devices in the testing of these devices. Multiple devices are mounted within a device strip carrier and are positioned in the testing position. This positioning of the device strip carriers is performed using device strip carrier alignment tools; the device strip carrier can readily be repositioned with respect to the test head/probe card for testing of multiple devices contained within the device strip carrier.

14 Claims, 7 Drawing Sheets

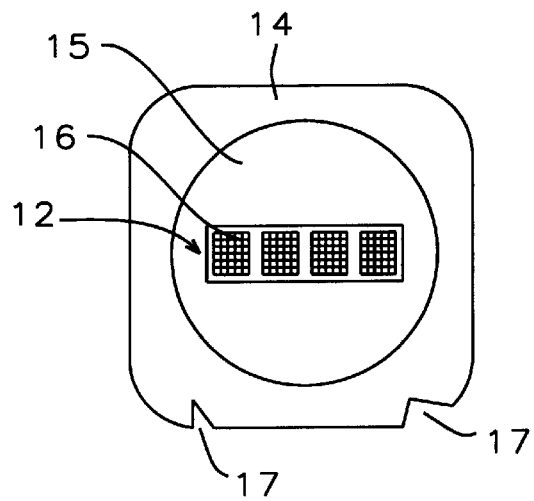
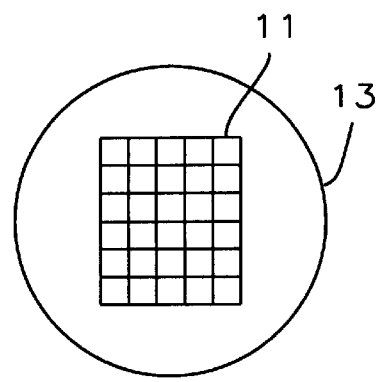
FIG. 1a　　　　　　　FIG. 1b
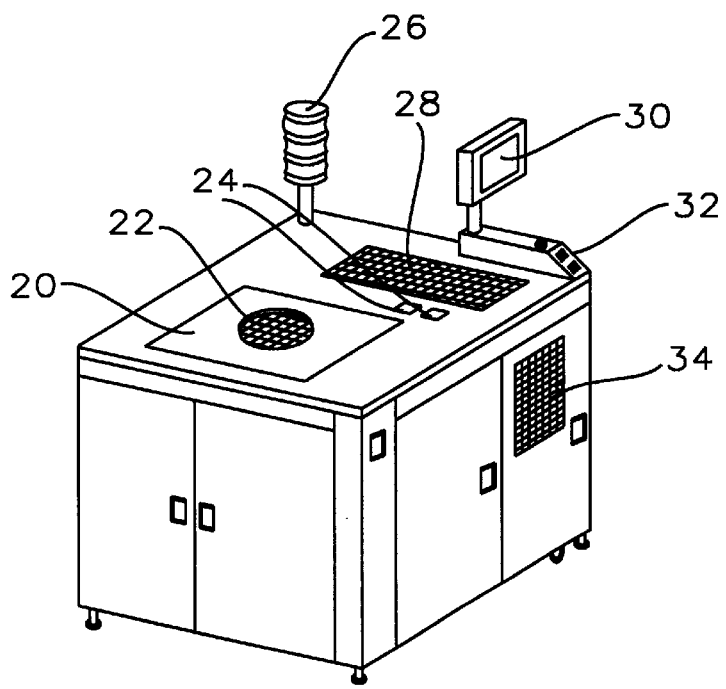
FIG. 2

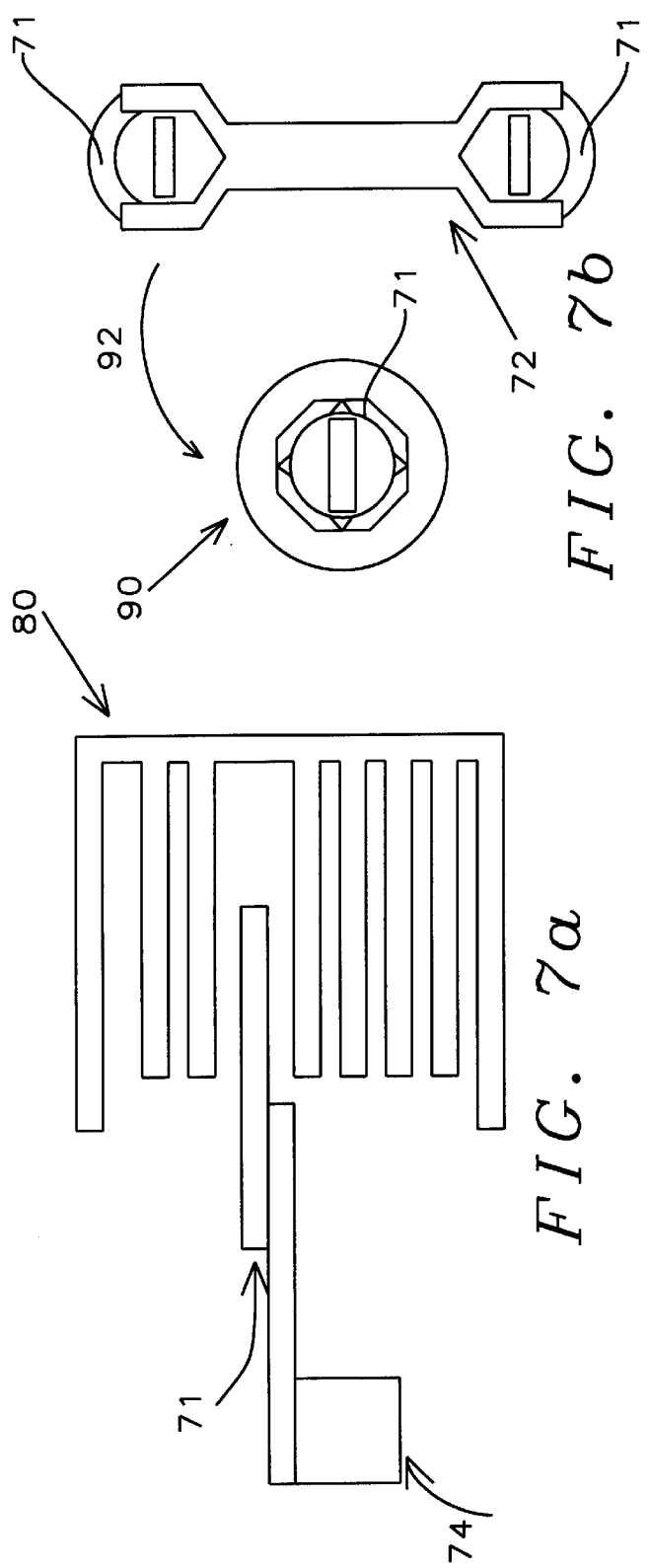
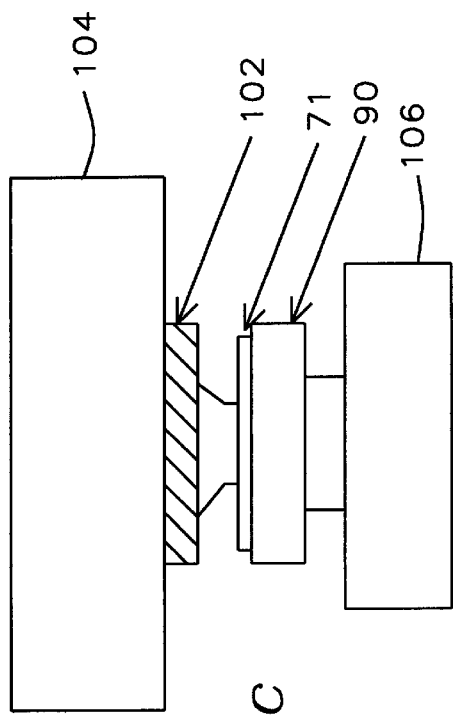
FIG. 7a
FIG. 7b
FIG. 7c

TESTING OF BGA AND OTHER CSP PACKAGES USING PROBING TECHNIQUES

BACKGROUND OF THE INVENTION (1) Field of the Invention

The invention relates to the fabrication of semiconductor Integrated Circuits, and more specifically to a method of final testing of Ball Grid Array (BGA) and Chip Scale Packaging (CSP) Integrated Circuit chips.

(2) Description of the Prior Art

A Ball Grid Array (BGA) is an array of solderable balls placed on a chip carrier. The balls contact a printed circuit board in an array configuration where, after reheat, the balls connect the chip to the printed circuit board. BGA's are known with 40, 50 and 60 mils. spacings in regular and staggered array patterns.

In order to test a BGA device, the contactor elements of the BGA device are inserted into a contactor plate having a plurality of sockets. The contactor plate is coupled to a Device Under Test (DUT) board, which is coupled to a testing machine. The DUT board is in essence a printed circuit board that completes electrical connections between the BGA contactor elements via the contactor plate and the tester. In order to test the BGA device, the tester sends signals to and receives signals from the BGA device via the electrical conductor paths provided by the contactor plate and the DUT board.

At present the final testing of semiconductor Integrated Circuits is performed using Integrated Circuit Handler apparatus whereby each of the IC packages is handled as an individual unit and is advanced to the test socket of the DUT by either gravity feed or by using pick and place methods.

U.S. Pat. No. 5,570,033 (Staab) shows a spring probe BGA contactor.

U.S. Pat. No. 5,721,496 (Farnworth et al.) discloses a method for testing unpackaged dies.

U.S. Pat. No. 5,729,896 (Dalal et al.) displays a Flip chip carrier.

U.S. Pat. No. 5,574,668 (Beaty) teaches a method for measuring BGA devices.

SUMMARY OF THE INVENTION

The present invention teaches an apparatus and method for testing integrated semiconductor circuits by means of device strip testing using probing techniques.

Using the current practice of handling integrated circuit packages on an individual basis presents problems of difficulty of handling the ever-decreasing size of the packages. Shrinking integrated circuit packages further aggravate the problems of increased tooling costs and increased lead time for test kit modifications due to the smaller IC packages and to the higher demands posed by the more accurate tolerances required for the smaller IC packages.

The present invention addresses these problems by using a new method of testing the IC packages. The need to handle IC packages on an individual basis is eliminated by using IC probing techniques applied by means of a modified probing apparatus. The individual testing of each semiconductor device will in this manner be replaced by Device Strip Testing which will be performed by the modified probing apparatus. The present invention does not require new or special tooling with the exception of the probe card which is unique for and adapted to each type of IC package. The time required to handle and test the integrated circuits will as a consequence be sharply reduced.

A plurality of individual BGA/CSP chips will be mounted on a strip, this strip will be referred to as the device strip. The device strip in turn will be mounted on an adhesive tape attached to a rigid platform (known as wafer ring) for handling of the device strip before, during and after device testing operations. This platform will be referred to as the device strip carrier. The number of BGA/CSP chips that can be mounted on one device strip is determined by the length of the device strip and by a particular package size. A device strip carrier that, for instance, can handle a device strip with a length of 8 inches (this length can be increased or decreased to fit into a 12-inch wafer frame) is referred to as a 12-inch device strip carrier.

The device strip is typically made of bismaleimide triazene (BT) substrate material. The BGA/CSP devices are strip mounted to the strip carrier using adhesive tape, this operation is a machine operation. The strip to strip carrier mount accuracy in the X and Y-directions is ±0.05 mm, the theta rotation accuracy is ±0.5 degrees.

A device strip is further subdivided into sites; each site contains a multiplicity of BGA/CSP chips or devices.

To summarize the above:

a multiplicity of BGA/CSP devices forms a site a multiplicity of sites forms a device strip one or more device strips may be mounted on a device strip carrier.

the device strip carrier provides the means for handling the BGA/CSP devices in the new device probing apparatus.

The new probing apparatus of the present invention has the following performance characteristics:

1) be capable of handling 12 inch device strip carriers while the probing apparatus can easily be modified to handle either larger or smaller device strip carriers 2) use cassettes that serve as the means for handling a plurality of device strip carriers in the environment of the new probing apparatus 3) use a loading/unloading arm for loading/unloading device strip carriers into and from device strip carrier cassettes 4) provide alignment of the Device Under Test (DUT)

5) be equipped with a loader/unloading transfer arm that transfers the device strip carrier from the loading/unloading arm to the device testing platform (the main chuck and heater table, see following item) and that can handle 12 inch device strip carriers and that can be easily modified to handle either larger or smaller device strip carriers 6) be equipped with a main chuck and heater table that secures the DUT during testing and that can handle 12 inch device strip carriers and that can easily be modified to handle either larger or smaller device strip carriers 7) provide two types of stepping capabilities, that is device to device within a site and site to site within a device strip.

BRIEF DESCRIPTION OF THE DRAWINGS

FIGS. 1a and 1b show a plan overview of a BGA/CSP device strip with its supporting device strip carrier.

FIG. 2 shows an isometric view of the probe handler.

FIGS. 7a through 7c show cross sectional views and plan views of the BGA/CSP testing apparatus.

DETAILED DESCRIPTION OF THE PREFERRED EMBODIMENTS

Figure 3:
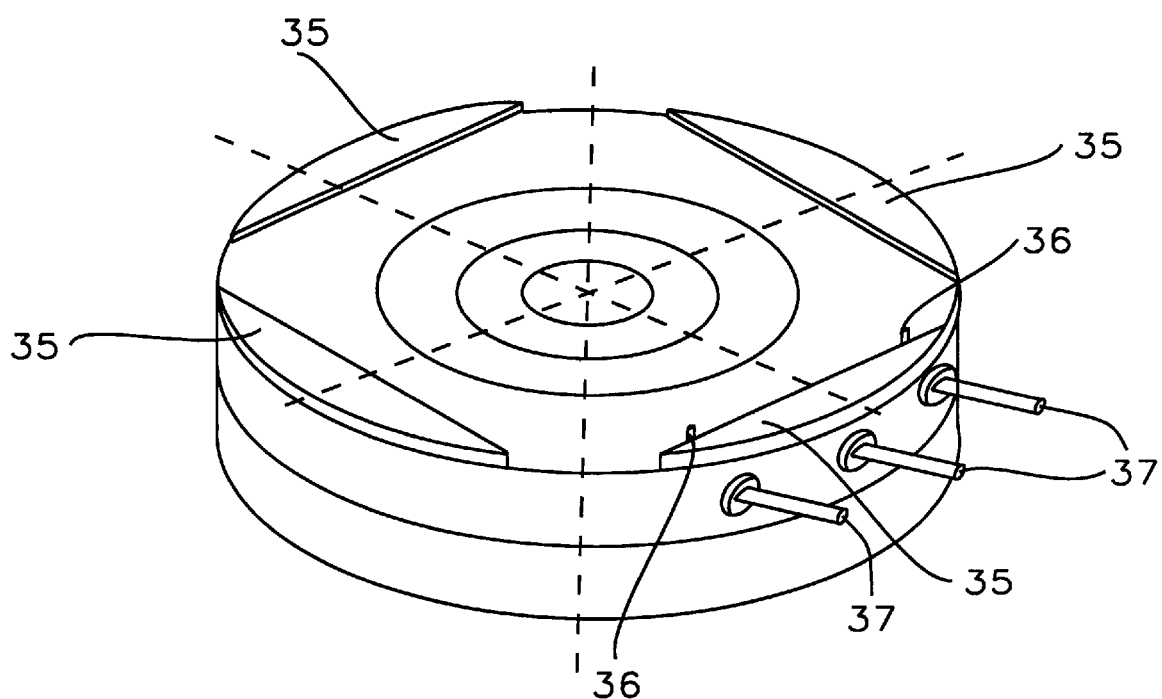
FIG. 3 shows a plan view of the main chuck and heater table.

Turning now more specifically to FIG. 1a, there is shown a plan overview of a BGA/CSP device strip carrier 14 on top of which a device strip 12 of BGA/CSP devices has been positioned. The present diameter of this BGA/CSF strip carrier is 12 inches. The BGA/CSP device strip carrier 14 will be used as the base for handling the BGA/CSP devices in the device prober. One site within the device strip 12 is indicated by 16, the device strip 12 contains a multiplicity of device sites. Each device site 16 within the device strip contains a multiplicity of BGA/CSP devices as further detailed in FIG. 1b. The presently envisioned length of the device strip 12 is 8 inches (typically 190 mm), this length can however readily be reduced or extended to 10 inches or any other size dependent on particular device strip and device testing applications. The thickness of the carrier plate 14 should typically not exceed the thickness of the BGA/CSP device of 1.4 mm. The device strip 12 is kept in position within the device strip carrier 14 by means of a surface 15 of sticking or adhering film. Cutouts 17 provided in the circumference of the BGA device strip carrier 14 serve to guide the insertion of the BGA device strip carrier 14 into the BGA probe handler, this will be discussed at a later time under FIG. 2.

FIG. 1b shows a plan view enlargement of one site 13 with one BGA/CSP device 11 embedded.

FIG. 2 shows an exploded perspective view of the BGA probe handler of the present invention.

Identified within the BGA probe handler are the following sub-sections; 20 is the docking plate, 22 is the device strip heater table, 24 are the openings to mount the camera and laser sensors, 26 is the tower lamp, 28 is the top door for access to the device strip carrier cassette (this cassette serves to store and handle the device strip carriers and will be explained under FIG. 5 following; see also the following paragraph), 30 is the touch screen for human operator control, 32 is the operator control panel and 34 is the loading and unloading door for the device strip carrier cassette. The heater table 22 will be further highlighted within the scope of the present invention.

The cassette used during the operation of the BGA probe handler serves as a mechanical means for storing a multiplicity of BGA device strip carriers, BGA device strips are mounted onto the BGA device strip carrier 14 (FIG. 1a). The cassette as a unit is inserted into the BGA device probe handler. The device strip carrier 14 (FIG. 1a) is inserted into or removed from the cassette, this insertion into or removal from the cassette is performed by the device strip carrier loader/unloader arm and typically takes place before or after BGA/CSP device testing.

Docking plate 20 serves to mate the device strip carrier 14 (FIG. 1a) with the heater table 22 that is positioned on top of and forms part of the device handler apparatus.

The heater table 22 serves to control the temperature of the device strip 12 (FIG. 1a) that is mounted in the BGA device probe handler and as such enables device testing under extreme conditions of temperature.

The camera and laser sensors are mounted into the BGA probe handler via openings 24. The laser sensor senses the thickness of the BGA device strip 12 (FIG. 1a) and provides data that allow for thickness (of the BGA device strip 12) compensation and, as a consequence, for the exact positioning of the tester probe. There are two cameras provided with the probe handler. One camera monitors the position of the BGA device strip 12 (FIG. 1a) and aligns the device strip for proper position within the probe handler. The second camera monitors the pins of the tester probe and assures alignment of the tester probe pins with the BGA device strip.

The tower lamp 26 performs the conventional function of drawing attention to the BGA probe handler if unusual conditions are detected related to the probe handler or any other operational condition of environment or control related to the BGA device strip. The tower lamp 26 is, in other words, a means whereby the equipment, in this case the BGA probe handler, draws the attention of a human operator.

The touch screen 30 combined with the operator control panel 32 provide the means by which the human operator of the BGA probe handler controls and directs functions related to the operation of the BGA probe handler. These functions can include BGA device loading into the BGA probe handler, removing of the BGA device from the BGA probe handler, adjusting BGA device strip temperature possibly together with the time duration during which the BGA device is exposed to a given temperature, human operator interfacing with and control of probe handler camera and/or laser functions, releasing or opening of the cassette loading and unloading doors, and others.

The top door 28 provides access to the BGA device cassette once this cassette has been positioned within the BGA device handler.

The BGA device strip carrier cassette loading/unloading door 34 serves as the point of entry or exit of the BGA device strip carrier cassette into and from the BGA probe handler apparatus. Door 34 can, the same as door 28, be manually operated by the operator of the BGA probe handler.

FIG. 3 shows an exploded perspective view of the heater table of the BGA probe handler. Specifically highlighted are the BGA device strip carrier guides 35, the BGA device strip carrier orientation pins 36 and the vacuum ports 37. The BGA device strip carrier guides 35 (four in total, mounted as shown at equal intervals around the periphery of the heater table) serve to position the BGA device strip carrier 14 (FIG. 1a) on which the BGA device strip 12 (FIG. 1a) is mounted into the heater table. Vacuum ports 37 allow for vacuum suck to keep the BGA device strip carrier 14 (FIG. 1a) in place during the time that the BGA device strip carrier 14 (FIG. 1a) is mounted in the probe handler table. BGA device strip carrier orientation pins 36 further facilitate the insertion of the BGA device strip carrier 14 (FIG. 1a) into the heater table. Opposing and matching cutouts have been provided for this purpose in the circumferences of the BGA device strip carrier 14 (see 17, FIG. 1a).

Figure 4:
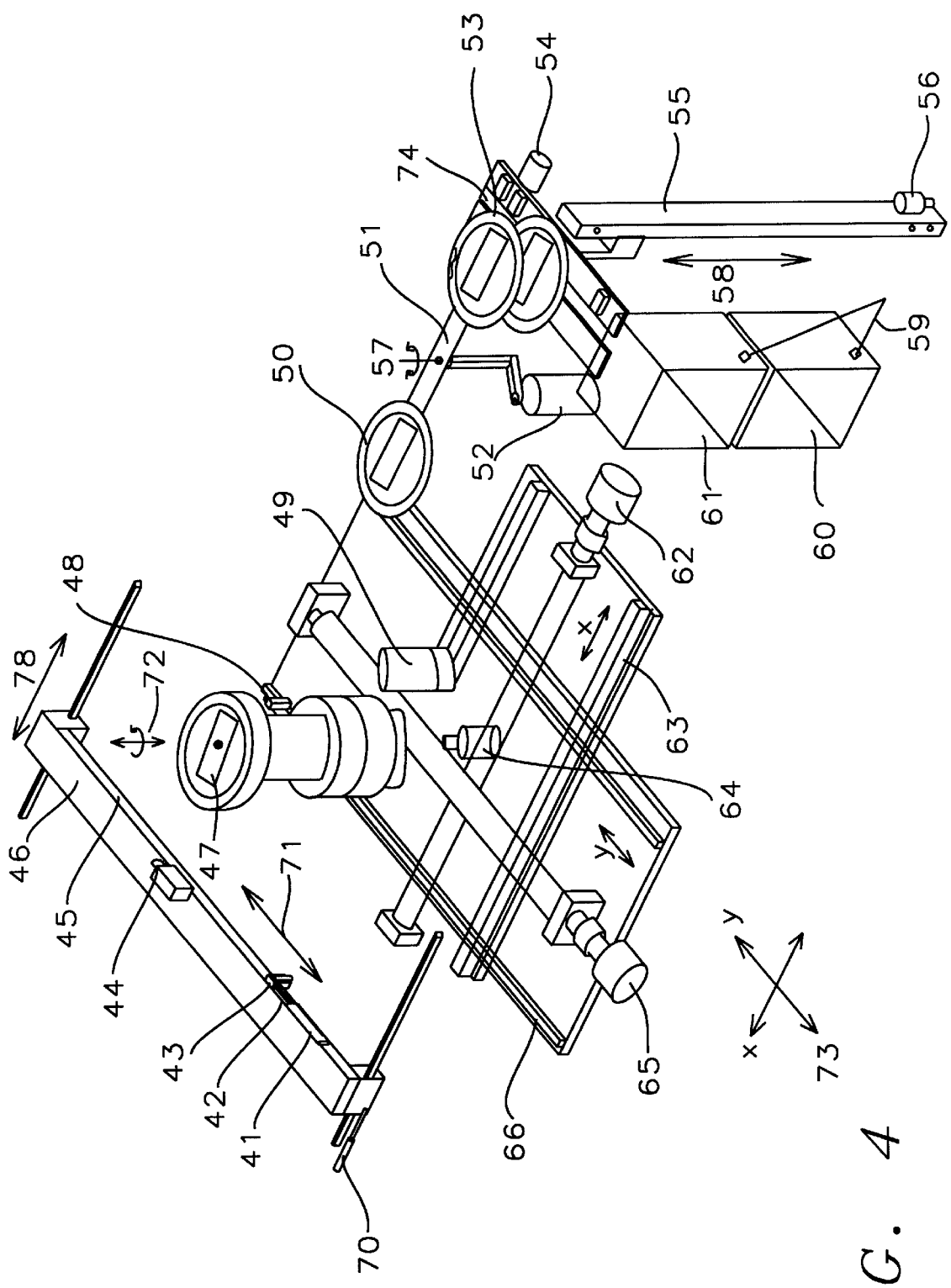
FIG. 4 shows a detailed plan view of the probe handler.

FIG. 4 shows an exploded perspective view of the probe handler. The various components within this probe handler are as follows:

- 73 provides a diagram that defines the X and Y direction as used within FIG. 4, it is understood that the Z-direction is the direction that is perpendicular to the indicated X-Y plane,
- 41 is a double action pneumatic cylinder for movement of ink marker 42, 42 is an ink marker used as part of the probe handling procedure, 43 is an ink marker slide, used as part of the probe handling procedure, this ink marker slide moves the ink marker in the Y-direction, 44 is camera #1, this camera is used to record and control the position of the BGA device strip and aligns the BGA device strip within the probe handler apparatus, 45 is the proximity sensor, this sensor determines the BGA device strip thickness and as such provides data that allow for variation in this thickness. This variation in BGA device strip thickness requires that the position of the test probe is adjusted in order to make proper contact with the BGA device strip, 46 is the camera slide that allows movement of camera #1 (44) that records and controls the position of the BGA device strip within the probe handler, 47 is the probe handler table, this table is equipped with (not shown) a heater and vacuum suction and must, during BGA device strip testing, be positioned in the appropriate Z-height position to make contact with probes, 48 is the camera #2, this camera monitors the tester probe pins and in so doing assures proper alignment between these tester probe pins and the BGA device strip, 49 is the stepper motor with encoder, used for theta position/alignment of the strip, 50 is the vacuum suction applied to keep the BGA device strip carrier 14 (FIG. 1a) in place once it is placed on device carrier transfer arm 51, 51 is the device strip carrier transfer arm which is used to transfer the BGA device strip carrier between the BGA device strip carrier input or loading position (the BGA device strip carrier input/output magazine or cassette) and the testing/heater table position and visa versa, 52 is a servo motor for the BGA device strip carrier transfer arm 51, this servo motor actuates the rotation 57 of the BGA device strip carrier transfer arm 51, 53 is a grip finger, grip finger 53 takes possession of or clamps the BGA device strip carrier after the BGA device strip carrier has been moved by the BGA device strip carrier loading/unloading arm from the device input/output magazine/cassette 60/61 to the position of the BGA device strip carrier transfer arm 51, the grip finger 53 holds the BGA device strip carrier during the process of physical transfer of the BGA device strip carrier to and from the BGA device strip carrier transfer arm 51, 54 is the servo motor for the BGA device strip carrier loading/unloading arm 74, this servo motor actuates the BGA device strip carrier loading/unloading arm 74 in the Y direction, 55 is the device strip carrier slide for the BGA device strip carrier loading/unloading arm 74, the BGA device strip carrier loading/unloading arm 74 can move in the Z-direction and, in so doing, access different BGA device strip carriers stored at different levels or heights within the BGA device strip carrier input or output magazines 60 and 61 respectively, 56 is a servo motor, this servo motor actuates the BGA device strip carrier loading/unloading arm 74 in the Z-direction, 57 is the rotation in which the BGA device strip carrier transfer arm 51 can be turned, this rotation 57 transfers the BGA device strip carrier from the input position to the heater table position and visa versa, 58 is the motion of the BGA device strip carrier loading/unloading arm 74 in the Z-direction, 59 are two magazine sensors that indicate the position of the input and output magazine 60 and 61 respectively with respect to a home or true position, this home or true position must be true with respect to the position of the BGA device strip carrier loading/unloading arm 74, 60 is the input magazine, BGA device strip carriers that contain BGA device strips that are to be tested are entered into the probe handler apparatus via this magazine, 61 is the output magazine, BGA device strip carriers that contain BGA device strips that have been tested exit the probe handler apparatus via this magazine, 62 is the servo motor the actuates the X-table 63, 63 is the X-table, that is the table that can position the prober handler table 47 in the X-direction, 64 is a servo motor, this servo motor moves the heater table/chuck 47 in the Z-direction (up/down direction), 65 is the servo motor the actuates the Y-table 66, 66 is the Y-table, that is the table that can position the prober handler table 47 in the Y-direction, 70 is a pneumatic double action cylinder that can actuate movement 78 of the carrier slide 46, 71 is the direction that the ink marker 43 can move, 72 is the rotational direction of prober handler table 47, 73 is a diagram that indicates the X and Y direction as defined for the exploded perspective view of the probe handler, FIG. 4.

74. is the BGA device strip carrier loading/unloading arm.

The function of the heater table/main chuck is to hold and heat the BGA device strip carrier for elevated temperature testing. During actual testing, the heater table/main chuck step from device to device while making contact with the probe card and the pogo pins. The heater table/main chuck can move in the X, Y, and Z direction and has, in addition, rotational freedom of movement.

Figure 5:
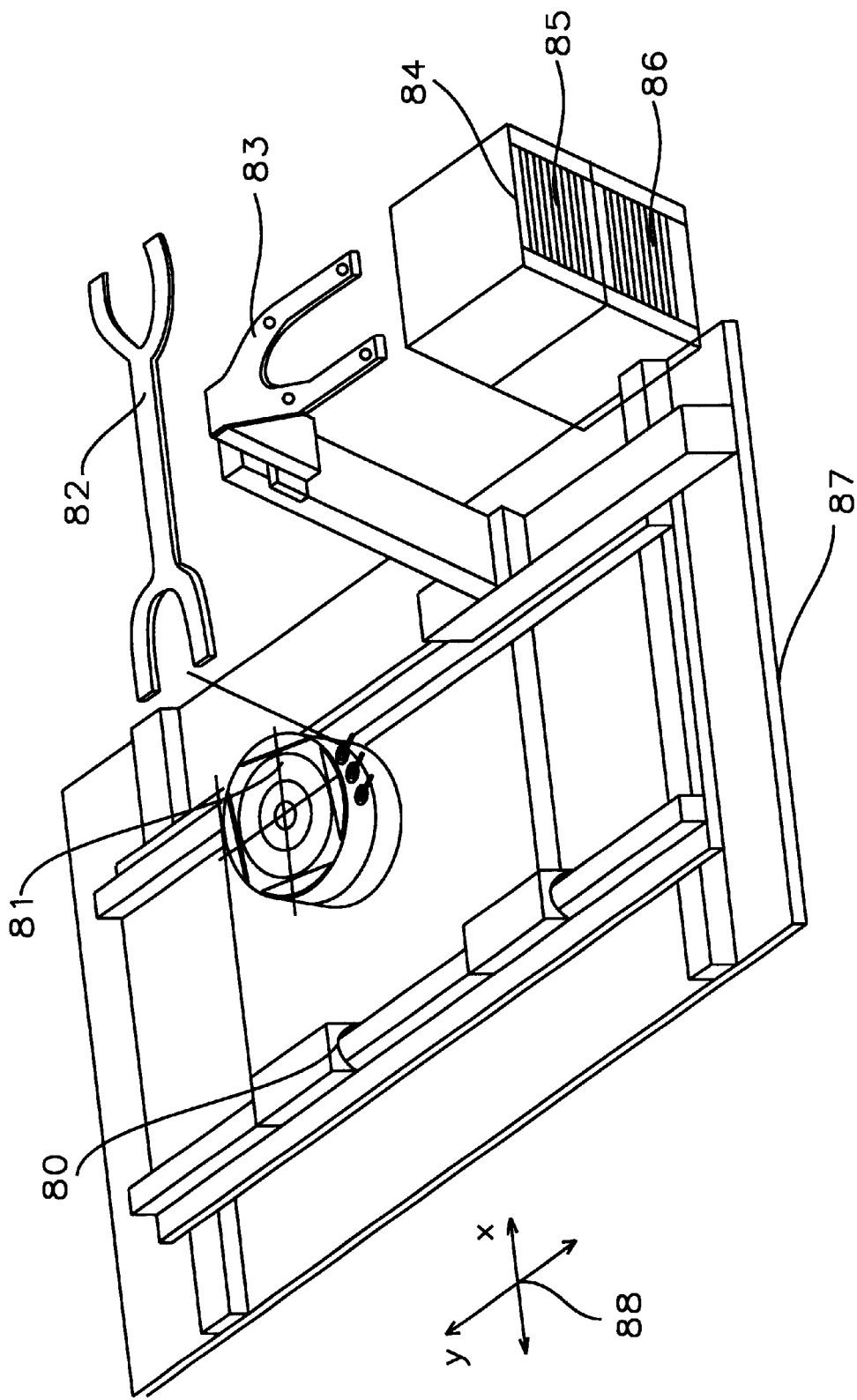
FIG. 5 shows a plan view of the probe handler with the device strip carrier cassette, the loading/unloading arm and the loading/unloading transfer arm and the main chuck/heater table.

FIG. 5 shows an exploded view of the BGA probe handler. Shown in FIG. 5 are:

80 is the X–Y table, 81 is the main chuck/heater table, 82 is the BGA device strip carrier transfer arm, this arm has been highlighted under 51, FIG. 4, 83 is the BGA device strip carrier loading/unloading arm, this arm has been highlighted under 74, FIG. 4, 84 is the BGA device strip carrier cassette, 86 is the storage location for the BGA device strip carrier for untested parts, this magazine has been highlighted under 60, the input magazine, FIG. 4, 85 is the storage location for the BGA device strip carrier for tested parts, this magazine has been highlighted under 61, the output magazine, FIG. 4, 87 is the probe handler base plate.

The function of the BGA device strip carrier cassette 84 is to hold the tested and untested BGA device strip carriers.

The function of the BGA device strip carrier loading/unloading arm 83 is to move BGA device strip carriers between the cassette and the loading/unloading transfer arm 82. The loading/unloading arm 83 can move in the X and Z direction (see diagram 88), this has been highlighted above as the function of item 74, FIG. 4.

The function of the BGA device strip carrier transfer arm is to lift BGA device strip carriers from the loading/unloading arm and place the BGA device strip carriers on the heater table/main chuck for probing. After probing is complete the BGA device strip carrier transfer arm will lift the BGA device strip carriers from the heater table and place the BGA device strip carriers onto the BGA device strip carrier loading/unloading arm.

Figure 6A:
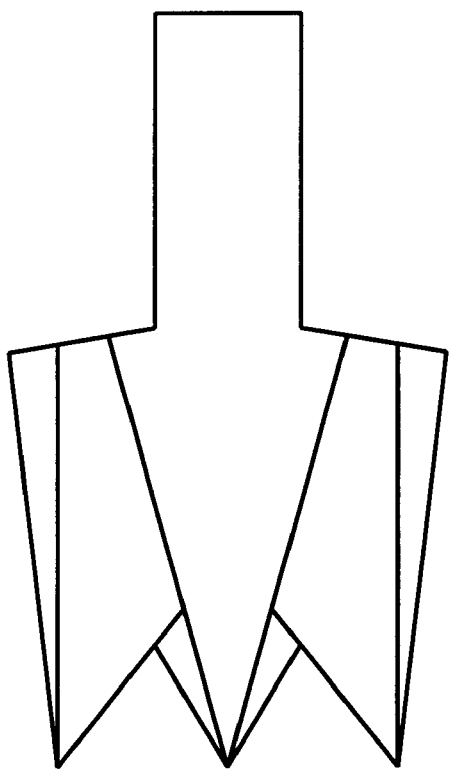
FIGS. 6a and 6b show two test probe pins. apparatus.
Figure 6B:
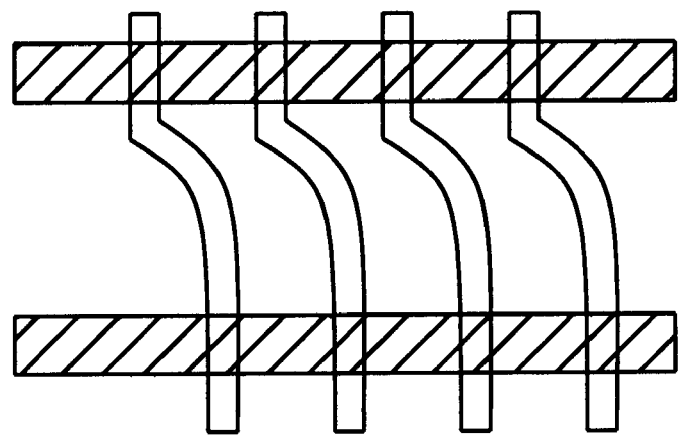

FIG. 6a and FIG. 6b show two types of probe pins that can be used for BGA/CSP device testing. These probe pins within the scope of the present invention must meet the following requirements:

1) be able to contact a contacting surface that comprises a spherical solder ball and also a flat surface.
2) accommodate a contacting or ball pitch, which varies from 1 mm. to 500 um.
3) accommodate a solder ball surface planarity of 100 microns.
4) vary in number from 4 to 64 to accommodate device packages that vary from 2×2 to 8×8 devices.
5) the location of the probes must be such that the contact balls in any matrix form that exists across the BGA/CSP device can be contacted.

In selecting the probe pins which can be used within the scope of the present invention the following types of pins can be considered:

1) vertical pogo pin, shown in FIG. 6a
2) cobra pin, shown in FIG. 6b
3) membrane pin, not shown.

These types of pins are known within the state of the art of semiconductor device testing and are not part of the present invention.

FIGS. 7a, 7b and 7c show how BGA/CSP devices will be tested within the scope of the present invention, that is using the device-probing concept combined with the BGA/CSP device strip carrier concept.

FIG. 7a shows how the device strip carrier 71 is stored and moved with the help of the device strip carrier cassette 80. The device strip carrier 71 is loaded into and unloaded from the device strip carrier cassette 80 using the loader/unloader arm 74. At the time that the BGA device strip carrier 71 has to be loaded onto the probe handler the loader/unloader arm 74 removes the strip carrier 71 from the strip carrier cassette 80 as shown in FIG. 7a.

FIG. 7b shows how the transfer arm 72 is used to lift the device strip carrier 71 from the loader/unloader arm 74 (FIG. 7a) onto the top surface 90 of the main chuck and the heater table with the motion 92.

The final assembly for testing the BGA/CSP device is shown in FIG. 7c where the device strip carrier 71 is positioned on the top surface of the main chuck/heater table 90 which is positioned on a chuck support table 106. The probe card 102 is attached to the test head 104. After lowering the probe card 102 onto the BGA/CSP device that is contained within the device strip carrier 71, the testing of the BGA/CSP device can take place.

Figure 8A:
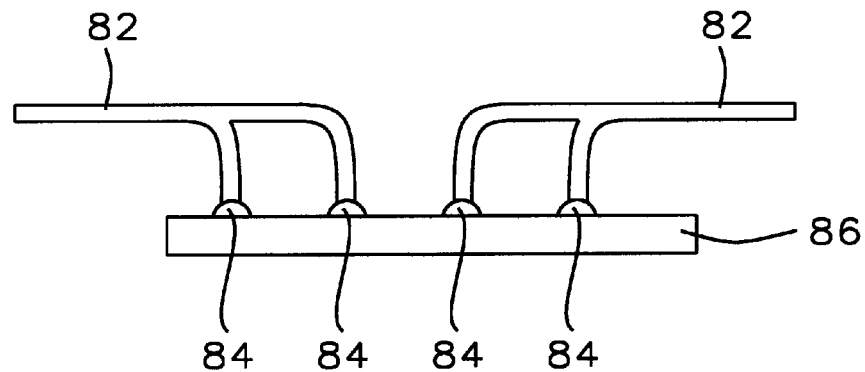
FIGS. 8a, 8b and 8c show cross sections of micro probing
Figure 8B:
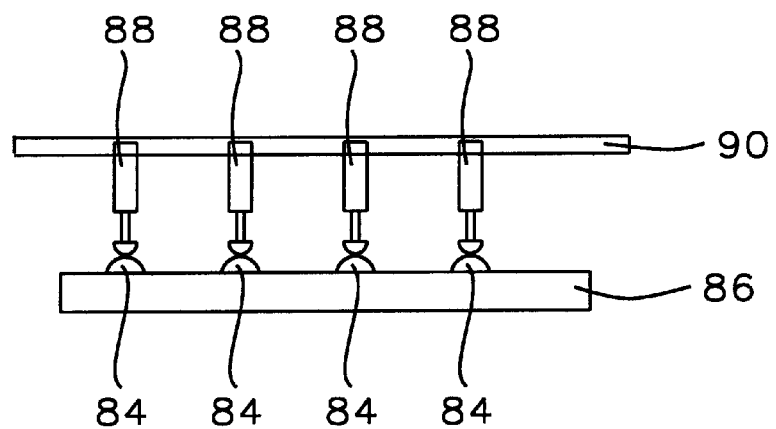
Figure 8C:
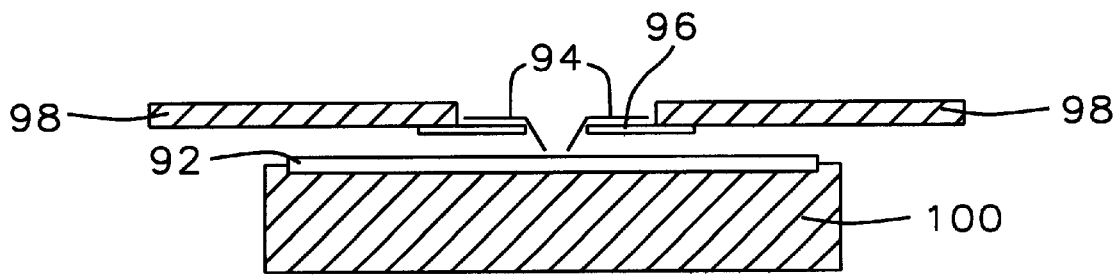

FIGS. 8a through 8c show further details of the construction of the probes used to test the BGA devices contained within the BGA device strip of the present invention.

FIG. 8a shows probes 82 that contact the balls 84 of the BGA device that is contained within the BGA package 86. Probes 82 approach the device balls under an angle, spring contact is in this manner established between the tester probes and the contact balls of the BGA device.

FIG. 8b shows another approach in the construction of the test probes. Probes 88 approach the contact balls of the BGA device in a direction that is perpendicular to the plane of the contact balls, probes 88 can be hollow in design whereby inside the body of the probe a spring (not shown) can be mounted that urges the head of the probe toward the balls 84 of the BGA device. The plane 90 represents a means of mounting the test probes and can, for instance, be a printed circuit board wherein further wiring is provided that forms part of the testing circuitry for the BGA devices under test.

FIG. 8c shows yet another approach to the construction of the test probes. A BGA device strip carrier 92 contains the BGA device that is to be tested (not shown). A docking plate 98 holds a prober card 96 into which the test probes 94 are mounted. The BGA device strip carrier is shown as being positioned on top of the heater table 100.

While the present invention has been shown and described with reference to the preferred embodiment thereof, it will be understood by those skilled in the art of semiconductor testing that the foregoing and other changes may be made therein without departing from the spirit and scope of the present invention.

What is claimed is:

1. A method of testing Ball Grid Array (BGA) or Chip Scale Packaging (CSP) devices, comprising:
   providing a BGA or CSP measurement apparatus for measuring GA or CSP devices, said measuring apparatus to contain a test head;
   providing BGA or CSP devices, said BGA or CSP devices being arranged in device strips;
   providing a probe card for forming an interface between said test head and a device under test;
   providing a device strip carrier onto which a multiplicity of devices are attached;
   providing a main chuck or heater table for supporting and heating said device strip carrier;
   providing a means for loading and unloading said device strip carrier into and from the device testing position;
   providing alignment tools for loading and unloading of said device strip carrier relative to a device testing position; and
   providing a device strip carrier storage medium.

2. The method of claim 1 wherein said device strip to have a first and a second dimension, said device strip further being in one plane, said first dimension of said device strip exceeding said second dimension of said device strip in a direction that is perpendicular to said first dimension by a measurable amount, said device strip comprising a multiplicity of BGA or CSP device sites, said BGA device sites being in said plane of said device strip and furthermore being arranged along said first dimension of said device strip, said BGA device sites comprising a multiplicity of BGA devices, said BGA devices being in a plane of said device sites furthermore being arranged along said first and second dimension of said device strip.

3. The method of claim 1 wherein said device strip carrier contains one device strip.

4. The method of claim 1 wherein said device strip carrier contains a multiplicity of device strips.

5. The method of claim 1, said probe card comprising a multiplicity of probe cards wherein a probe card matches with and is dedicated to a known type of BGA or CSP device, wherein furthermore each probe card interfaces between and establishes electrical contact with a test head and at least one BGA or CSP device within said device strip carrier, whereby furthermore each probe card has a three dimensional freedom of movement and is provided with three types of stepping capabilities, said stepping capabilities comprising stepping from a device to another device whereby said devices are contained within a site, said stepping capabilities further comprising stepping from one site to another site whereby said sites are contained within a device strip, said stepping capabilities further comprising stepping from one device strip to another device strip.

6. The method of claim 1, said device strip carrier comprising a circular metal plate, said metal plate containing a means of positioning said device strip in a fixed position with respect to said device strip carrier, said device strip carrier furthermore providing a mechanical interface between said device strip and said main chuck or heater table, said device strip carrier furthermore providing a means of easy and accurate access to and positioning of said device strip within said main chuck or heater table.

7. The method of claim 1, said device strip carrier comprising a ceramic plate, said ceramic plate containing a means of positioning said device strip in a fixed position with respect to said device strip carrier, said device strip carrier furthermore providing a interface between said device strip and said main chuck or heater table, said device strip carrier furthermore providing a means of easy and accurate access to and positioning of said device strip within said main chuck or heater table.

8. The method of claim 1, said device strip carrier comprising a support plate, said support plate containing a means of positioning said device strip in a fixed position with respect to said device strip carrier, said device strip carrier furthermore providing a mechanical interface between said device strip and said main chuck or heater table, said device strip carrier furthermore providing a means of easy and accurate access to and positioning of said device strip within said main chuck or heater table.

9. The method of claim 1 wherein said means for loading and unloading said device strip carrier into and from said device testing position comprises a combination of a device strip carrier loading/unloading arm and a device strip carrier transfer arm wherein said loading/unloading arm has at least a two-dimensional freedom of movement in an X or Y or Z direction, said loading/unloading arm being able to move said device strip carrier from a device strip carrier storage medium to said device strip carrier transfer arm, said device strip carrier storage medium being positioned at a fixed distance from said loader/unloader arm, said loading/unloading arm successively and individually accessing a multiplicity of device strip carriers stored within said device strip carrier storage medium, whereby furthermore said device strip carrier transfer arm moving or transporting said device strip carrier from said loader/unloader arm to said main chuck or heater table, said device strip carrier transfer arm being able to clamp said device strip carrier during a time that said device strip carrier is handled by said device strip carrier transfer arm.

10. The method of claim 1, wherein said main chuck or heater table comprising a structure having a flat, circular top surface, said main chuck or heater table being provided with guide and orientation pins for quick and accurate insertion of said device strip carrier into said main chuck or heater table, said main chuck or heater table allowing use of one or more 12 inch long device strip carriers, said main chuck or heater table structure extending to accommodate device strip carriers in excess of 12 inches long, elevated temperatures being created by and applied to said device strip carrier by said main chuck or heater table, said elevated temperatures being created either by design features of and contained within said main chuck or heater table or being created by a separate heater table and being transferred to said device strip carrier by thermal convection and via said main chuck or heater table.

11. The method of claim 1 wherein a vertical or Z-axis height of the main chuck or heater table thereby including the device strip carrier thereby including the probe card thereby including the test head allows for testing of BGA devices contained within said device strip carrier with a thickness in excess of 1 mm.

12. The method of claim 1, said device strip carrier storage medium comprising a device strip carrier cassette wherein a multiplicity of device strip carriers can be contained in a vertical or Z-axis arrangement and which provides adequate protection to the device strip carriers during storage and transportation of said device strip carriers.

13. The method of claim 1 wherein said alignment tools for loading and unloading of said device strip carrier relative to the device testing position contain proximity sense and positioning capabilities that on a continuing basis monitor and direct the position of the device strip carrier with respect to the device testing position.

14. The apparatus of claim 1, said probe card comprising a multiplicity of probe pins, said probe pins being able to contact a contacting surface comprising a spherical solder ball and also a flat surface, said probe pins furthermore being able to accommodate a contacting or ball pitch varying from 1 mm. to 500 µm, said probe pins furthermore being able to accommodate a solder ball surface planarity of 100 microns, said probe pins varying in number from 4 to 64, thereby accommodating device packages varying from 2×2 to 8×8 devices, said probe pins being located such that contact balls in any matrix form existing across a BGA or CSP device are contacted, said probe card having three dimensional freedom of movement and being provided with three types of stepping capabilities, said stepping capabilities comprising device to device within a site and site to site within a device strip and device strip to device strip.

* * * * *